United States Patent [19]
Aoyama et al.

[11] Patent Number: 5,651,827
[45] Date of Patent: Jul. 29, 1997

[54] SINGLE-WAFER HEAT-TREATMENT APPARATUS AND METHOD OF MANUFACTURING REACTOR VESSEL USED FOR SAME

[75] Inventors: Masaaki Aoyama; Hiroyuki Miyazawa, both of Takefu, Japan

[73] Assignees: Heraeus Quarzglas GmbH, Hanau, Germany; Shin-Etsu Quartz Products Co., Ltd., Tokyo, Japan

[21] Appl. No.: 583,774

[22] Filed: Jan. 11, 1996

[51] Int. Cl.$^6$ .................................................. C23C 16/00
[52] U.S. Cl. ................................................................ 118/725
[58] Field of Search ....................................... 118/725

[56] References Cited

U.S. PATENT DOCUMENTS

| | | | |
|---|---|---|---|
| 4,911,896 | 3/1990 | Bihuniak | 422/429 |
| 4,926,793 | 5/1990 | Arima | 118/730 |
| 5,244,500 | 9/1993 | Ebata | 118/725 |
| 5,306,388 | 4/1994 | Nakajima | 156/620.4 |

FOREIGN PATENT DOCUMENTS

| | | |
|---|---|---|
| 543957 | 5/1932 | Germany . |
| 58-148427 | 8/1983 | Japan . |
| 59-050096 | 10/1984 | Japan . |
| 02055285 | 1/1990 | Japan . |
| 05000900 | 7/1993 | Japan . |
| 9417353 | 6/1994 | WIPO . |

OTHER PUBLICATIONS

Super LSI Fabrication Testing Apparatus Guide Book, Kogyo Chosakai, pp. 56–58.

*Primary Examiner*—Richard Bueker
*Attorney, Agent, or Firm*—Felfe & Lynch

[57] ABSTRACT

A reactor vessel includes a quartz glass body having sidewalls and a ceiling formed as a single unit without welds. Translucent or opaque portions are formed by bubbles in the glass where heat insulation is desired and transparent portions are formed by absence of bubbles where heat transmission and visibility are desired. The body is formed by adding quartz glass powder to a mold which is rotated about a central axis so that centrifugal force causes a layer of powder to form on the inside of the mold. The layer is then heated until it melts.

11 Claims, 8 Drawing Sheets

Fig. 1

PRIOR ART

Fig. 2

PRIOR ART

SINGLE-WAFER HEAT-TREATMENT APPARATUS AND METHOD OF MANUFACTURING REACTOR VESSEL USED FOR SAME

FIELD OF APPLICATION

The present invention relates to a single-wafer heat-treatment apparatus comprising a reactor vessel having a ceiling portion and a side portion, and a heater or heaters installed outside or inside the reactor vessel, whereby a single wafer is disposed at a predetermined position in the vessel for heat-treatment. The wafer processing may be an under-vacuum film-formation on a wafer, diffusion in a wafer, or chemical treatment such as CVD treatment of a wafer. Furthermore the invention relates to a method of manufacturing a reactor vessel for the apparatus.

PRIOR ART

Up to now, under-vacuum film-formation on a wafer, diffusion in a wafer, or chemical treatment such as CVD treatment of a wafer has been conducted in a so-called batchwise treatment mode with a plurality of wafers which are held in a boat and transferred into a reactor vessel.

In such a treatment mode, turbulence of a gas stream produced in the neighborhood of a contacting spot between a wafer and the boat and turbulence of a gas stream flowing in a space between adjacent wafers stacked one above the another both interfere with uniform treatment of all wafers in a batch.

In the recent trend of increase in the diameter of a wafer from 6 inches to 8 inches and further up to 12 inches, there arise difficulty manufacturing a boat and supporting details thereof compatible with increase in weight of a wafer, for processing is conducted in the batchwise treatment mode. In addition, enlargement of a reactor vessel corresponding to the increase in the diameter causes lack of uniformity of both temperature distribution in heating and of gas dispersion, which is accompanied by needless increase in power for heating.

In a process of fabrication of a semiconductor device with a higher packing density such as 64 M IC of the next generation, processing accuracy within a sub-micron scale is required. There is, however, unavoidable difficulty in attaining such a high accuracy in a conventional batchwise processing mode, since the upper side and lower side of a wafer stacked in a boat is not subject to uniform treatment conditions. It is also the case that between gas flowing-in and gas exhaust, adjacent wafers are influenced differently, and further particles are produced at a contacting spot between a wafer and the boat.

In order to eliminate such faults and to cope with the recent trends toward a larger diameter of a wafer, and a higher packed density and higher quality of a semiconductor device in the next generation, single-wafer heat-treatment apparatuses in which heat-treatment is conducted on a single wafer in each processing are drawing attention.

The single-wafer heat-treatment apparatuses are divided into the two categories, one of which is to install a heater or heaters within a reactor vessel and the other is to position the heater or heaters outside the reactor vessel.

Figure 1:
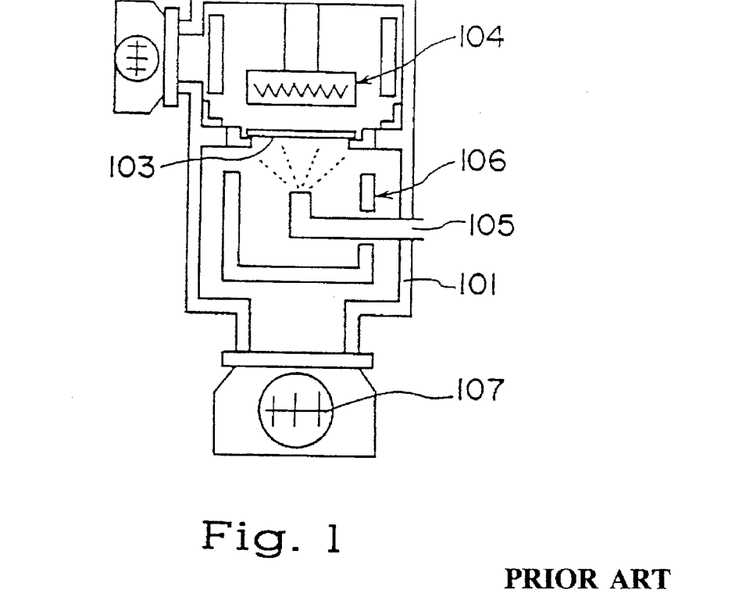
FIG. 1 is a schematic view illustrating the internal construction of a prior art single-wafer heat-treatment apparatus.

FIG. 1 shows an example of the apparatus which has a heater inside, which is disclosed in a book entitled "Super LSI Fabrication Testing Apparatus Guide Book" published by Kogyo Chosakai, in Table 5 of page 58. The apparatus of the example comprises a stainless chamber 101 as a reactor vessel, a wafer 103 disposed in the spatial center thereof by means of a susceptor 102, a heater 104 above the wafer 103, a gas nozzle 105 under the wafer 103, a water-cooled shroud 106 surrounding the nozzle 105, and a vacuum pump 107.

Figure 2:
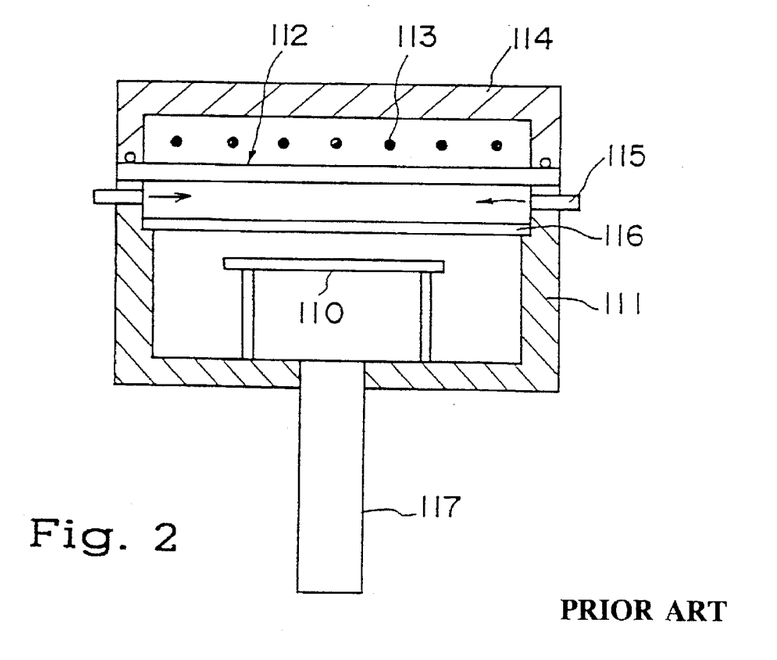
FIG. 2 is a schematic view illustrating the internal construction of another prior art single-wafer heat-treatment apparatus.

On the other hand, as an external-heater type apparatus, some are disclosed in Table 3 of page 56 of the aforementioned Guide Book. FIG. 2 shows an apparatus for heating a wafer from above, in which a quartz glass window 112 is attached in a sealing condition to an upper opening of a stainless vessel 111 which accommodates a wafer 110, heater lamps 113 and a housing 114 therefor are installed above the quartz glass window 112. The wafer 110 is heated through the quartz glass window 112, where a gas inlet 115 feeds gas to a distributor plate 116 and a channel 117 for an exhaust gas communicates with a vacuum pump.

In the former internal-heater type apparatus, a water-cooled shroud is installed as a heat shield between the vessel and a heated region, and from that a problem arises in regard to uniform distribution of heating.

On the other hand, even in the latter external-heater type apparatus, in order to prevent heat deterioration of an O-ring lying between the quartz glass window 112 and a sealing portion 112a at the upper end of the stainless vessel 111, the portion in the vicinity of the sealing portion 112a is required to be water-cooled. The problems of uniform distribution of heating and complication of structure therefore remain.

In either technique, complication of the structures is unavoidable due to necessary water-cooling of a greater part of the apparatuses. A problem arises in holding a degree of air-tightness, since the junction between the heat-transparent material and the water-cooled material is unavoidably positioned close to the heat-receiving portion, and besides another problem is brought about in relation to adopting the stainless vessel as a reactor vessel.

In light of the above-mentioned circumstances, a study is conducted about a vessel all composed of transparent quartz glass similar to a conventional furnace tube as an alternative of the above-mentioned reactors. For example, a reactor vessel is proposed which comprises an end cover and a lower vessel in Table 3 of page 56 of the aforementioned Guide Book, which also has a problem that an O ring at a sealing portion is subject to deterioration, since the O-ring is required for sealing when the vessel is thus divided into two parts. Therefore, a single-wafer heat-treatment apparatus, too, is studied that has shapes approximating a dome or a cylinder at an end of which an end cover shaped as a flat plate or a hemisphere is welded, similarly to the shape of a conventional vertical furnace tube.

In the past, a wafer was generally smaller than 6 inches in diameter and a reactor tube was manufactured by a welding technique. For wafers 8 inches or 12 inches in diameter the reactor vessel has to be enlarged, but it is difficult to weld such a large reactor vessel having sufficient mechanical strength.

What is more, a quartz glass reactor vessel is manufactured with transparency in order to be able to receive heat from the outside. To manufacture it all with such transparency requires heating a wider portion in the reactor vessel than necessary for heating a wafer. As a result, unnecessary reactions in the vessel or unfavorable influences on facilities in the neighborhood around the vessel take place.

Using transparent quartz glass as a structure material means good heat conduction and therefore the sealing flange has to be remote from the heating region, so that the reactor vessel unavoidably becomes larger in diameter and thus also larger in height in order to have the sealing portion far enough from the heated region.

SUMMARY OF THE INVENTION

It is an object of the present invention to provide a heat-treatment apparatus which secures enough mechanical strength of its own and uniformly heats a wafer even when the reactor vessel is enlarged to accommodate a wafer with a diameter of 8 to 12 inches.

It is another object of the present invention to provide a heat-treatment apparatus that secures both a heat insulation effect and uniform heating effect of a heated region of a wafer, prevents any portion of the vessel for which heating is unnecessary from being heated, effectively stops unnecessary reactions, and prevents a sealing portion and neighboring facilities being unfavorably affected.

It is a further object of the present invention to improve efficiency in loading and unloading wafers.

What is featured by the present invention is that the reactor vessel is substantially a single body, at least a heated region of the reactor vessel includes no welded portion, and at least a part of the heated region is translucent or opaque by bubbles distributed almost throughout the bulk of the region.

In a first preferred embodiment of the invention, which is applicable to both external-heater type or internal-heater type wafer heat-treatment apparatus, the former of which has a heater or heaters outside the reactor vessel and the latter of which has the heater or the heaters inside the reactor vessel, almost all of the heated region or heated regions contain enough bubbles therein as to be translucent or opaque.

The reactor vessel is generally shaped as approximation of a hemisphere, a dome, or a cylinder and preferably it all is composed as a single body except a flange portion.

It is necessary that the circular opening of the lower end of the reactor vessel later may join a flange by welding along the outer periphery, but the heated region and the ceiling of the vessel is composed substantially as a single body with no welded portion therein.

The translucent or opaque portion is not necessarily limited to the heated region and all the vessel may be translucent or opaque. A transparent window for observing a state of heat-treatment of a wafer may be arranged in a position where the window does not affect heat-treatment of a wafer in the heated region of the vessel. In other words, in the first embodiment the vessel can all be distributed with bubbles throughout the bulk, except a portion of the transparent window.

The definition of being translucent or opaque should preferably be is based on infrared radiation, for example transmittance of light at a wavelength of 2 μm, because the present invention intends improvement on uniformity of heating and to achieve it, heat is required to radiate through the ceiling portion to the surface of a wafer. A degree of being translucent or opaque is preferably set in the range of 30% to 1% in transmittance of light at a wavelength of 2 μm in order to exert a function as described later.

In order to maintain uniform heating and heat insulation over a long time of operation, according to the present invention, bubbles are included in the bulk of the wall to thereby prevent heat conduction through the thickness. The density of bubbles in the bulk of a heated region in the range of 20,000 bubbles/$cm^3$ to 100,000 bubbles/$cm^3$ with diameters of the included bubbles being in the range of 10 μm to 250 μm.

In an internal-heater type apparatus, however, a reactor vessel is constructed in a larger scale, since the heater is contained in the vessel. A water-cooled shroud is installed as a heat shield between the vessel and a heating region and thereby a problem is apt to arise in an aspect of uniformity of heating. Another problem is that pollutants from the heater attach on a wafer and thereby the surface of the wafer is polluted, since the heater is face to face with the wafer.

In a second embodiment of the invention, in which a heater or heaters are installed above the reactor vessel in the region of the ceiling portion, the ceiling portion is composed of substantially transparent quartz glass and almost all the side portion of the vessel covering from the heat-receiving portion to a sealing portion at the lower end of the vessel is composed of translucent or opaque quartz glass with inclusion of bubbles therein. It is preferable that the ceiling portion of the vessel is transparent at a transmittance of 85% or more at a wavelength of light of 2 μm and the side portion of the vessel between the heated portion and the ceiling portion has a transmittance of 30% or less at a wavelength of 2 μm, with a bubble density as described for the first embodiment.

If there exist a clear boundary like that caused by welding between the ceiling portion of the vessel and the side portion, a risk may arise that the boundary portion is locally heated or heat is scattered or reflected there in a poor uniformity and as a result a heated object is heated in a poor uniformity. According to the present invention, no clear boundary of inclusion of bubbles is present between the ceiling portion of the vessel and the side portion. The interface therebetween is composed in such a manner that densities of bubbles change gradually and the gradual change in bubble density preferably occurs substantially in the heated area surrounding the ceiling portion of the vessel.

The position where the wafer is located is preferably in the internal space of the vessel downward of the transparent portion of the ceiling portion.

The second embodiment of the invention secures both a heat insulation effect and uniform heating in a wafer heating region, prevents a portion of the vessel for which heating is unnecessary from being heated, and further effectively stops not only unnecessary reactions, but also both a sealing portion and neighboring parts from being unfavorably affected.

Since transmission of heat is in a lower level in the side portion of the vessel which is translucent or opaque, in other words, since a temperature in the area in the vicinity of the lower-end opening does not rise to an undesirable level, an O-ring is used for sealing by a flange even with no special precaution.

The reactor vessel is placed on a support table above which a wafer is disposed in a predetermined position with a sealing portion lying therebetween and the reactor vessel is preferably separable from the support table in a direction of moving away from each other. A channel for gas feed and an exhaust port are both preferably located on the side of the support table only, but not on the side of the vessel.

Since a reactor vessel and a support table above which a wafer is disposed in a predetermined position are relatively separable from each other in a direction of moving away from each other, loading and unloading of wafers becomes easier. With channels for a fluid attached on the side of the support table only, the reactor vessel and a heater above the vessel combined can be a movable portion, which is shiftable vertically. In other words, simplification of an apparatus comprising the vessel, support table and the like can be realized, because it is not necessary to move the channels for the fluid upward or downward.

Such a quartz glass reactor vessel is manufactured in the following manner in which: first, quartz powders are provisionally shaped in a rotating mold which has an upper opening and the inner shape is similar to the outer shape of the reactor vessel with the dimensions being equal to or slightly larger than those of the outer shape of the vessel. Second, the quartz powder shaped body is molten by directly heating so as to be processed in shapes approximating a hemisphere, a dome, or a cylinder and further to have in the heated region substantially a translucent or opaque portion due to bubbles included in the wall.

With such a technical means, effects of heat insulation and uniform heating of the heated region for a wafer are much improved, because the region itself is composed of quartz glass material, translucent or opaque, with poor heat conductance, in particular, a quartz glass having bubbles included therein with a light transmittance of 30% to 1% at a wavelength of 2 μm. The effect of uniform heating is decreased when light transmittance is 30% or more, and not meaningfully increased when light transmittance is 1% or less.

The transmittance of a light of a wavelength of 2 μm is preferably set so as to be different not only between the internal-heater type and the external-heater type, but also in dependence on a temperature of heat-treatment. For example, in the internal-heater type, the transmittance is preferably set in the range of 1% to 20% under a stress put on the effect of heat insulation and on the other hand, in the external-heater type, the transmittance is preferably set in the range of 5% to 30%, more preferably, in the range of 10% to 30% due to a necessity of a proper extent of transmittance. As to a bubble density, too, the density in the heated region, where bubbles are distributed in a uniform density, is preferably set so as to be different between both types. That is, in the internal-heater type, where the effect of heat insulation is stressed, various bubbles dispersed in the range of 10 μm to 250 μm are preferably included at a density selected from the range of 40,000 bubbles/cm$^3$ and on the other hand, in the external-heater type, at a density selected from the range of 20,000 bubbles/cm$^3$ to 80,000 bubbles/cm$^3$.

Under conditions of inclusion of bubbles at such a high density and the bulk internally being translucent or opaque, undesirable escape of heat into a region where heating is unnecessary is effectively prevented. This prevention of undesired heating invites increase in uniform heating in the heated region, also realizes thereby a stable level of productivity with a higher quality of product, and in addition allows the use of an O-ring for sealing without a special precaution, since the temperature at the flange portion attached along the outer periphery of the lower-end opening of the vessel does not go up to a high level.

In order to attain a state of being translucent or opaque, a sand-blasting treatment may be used, but this roughens only the surface of a transparent quartz glass body. Consequently, because an effect obtained by the sand-blasting treatment on a surface is restricted to the surface region with respect to being translucent or opaque, when an etching-treatment or heat-treatment is applied to the surface, the surface region becomes transparent. And what's worse, heat is conductible toward the flange side through the bulk of the wall. As a result, the apparatus does not function in a smooth manner.

According to the present invention, since heating is not conducted beyond a necessary region for heating a wafer, undesirable reactions or undesired influences on surrounding facilities do not arise, and heat-conduction outwardly from a heated region is prevented. The heated region and a sealing portion can be close to each other without a water-cooled shroud or water-cooled jacket, so that an apparatus for the use can be constructed in a smaller scale and in a simpler manner.

In a reactor vessel of the present invention, since at least a heated region is composed as a unit not having a welded portion, cracking or breakage due to thermal residual-strain is avoided at the interface.

Being composed substantially as a single body means that no local strain or biased loading in the heated region arises. Under conditions of vacuum and heating at about 1000° C., the region does not lose mechanical strength. With the increase in the mechanical strength, a higher-speed heating-up and higher-speed cooling-down of a wafer in a wafer treatment process is made possible, so that the productivity can be improved.

With a vessel according to the present invention, heating of the wafer is carried out without heating a wider portion than necessary, thereby preventing not only unwelcome reactions, but also undesired influence on the surrounding parts. The heated area and the sealing portion of the side portion can effectively be shielded by the side portion of the vessel therebetween, whereby the heated area can be located close to the sealing portion without a water jacket, so that the vessel is constructed in a small scale and a flat form and the apparatus can be simplified.

The vessel according to the present invention has no clear boundary by inclusion of bubbles between the ceiling portion and side portion thereof and to the contrary bubble densities are gradually changed in magnitude therebetween so as to include no bubble boundary. Thermal mechanical-strength is thus further increased and at the same time gradual descending of temperature along the distance from the ceiling portion of the vessel to the lower-end opening is made possible, so that a heating atmosphere with good balance which makes possible heat-treatment of a wafer with a higher quality is obtainable. Higher speed heating and a higher speed cooling are possible, so that productivity is improved. A transparent window portion is located in the side portion of the vessel with no welded portion so that the vessel is better in regard to airtightness and production.

Since the location of the wafer is in the internal space corresponding to a portion, translucent or opaque, downward of the transparent portion of the ceiling portion, the location is better not only in regard to observation by the naked eye, but also in regard to heat insulation. Exchange of wafers is easier, since the reactor vessel and the support table are separable. In addition, the pipe for introducing a gas and the exhaust port are located on the side of the support table, so that the reactor vessel and the heater portion can be constructed as a single vertically movable part.

Since the reactor vessel is quartz glass and a metal jacket is not used, a built-in window portion and confirmation of the internal state of the vessel are easier to achieve.

A heat transmittance of 85% or more to the wafer can be achieved even in an external-heater type heat-treatment apparatus.

Most of the side portion of the vessel from the ceiling portion to the lower-end opening is composed of bubbled quartz glass with heat transmittance of 30% or less, whereby insulation of the wafer-heating region is improved. Uniform heating throughout the vessel is improved by effective prevention of the escape of the heat to an area where heating is not necessary, so that production with a stable and higher quality becomes possible.

DETAILED DESCRIPTION OF THE PREFERRED EMBODIMENTS

Figure 3:
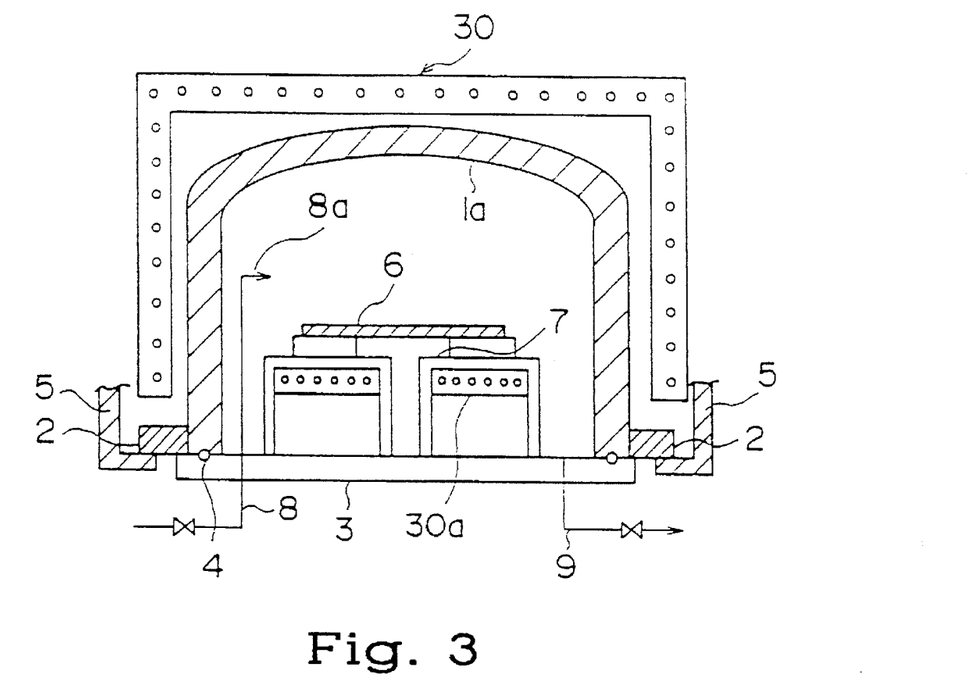
FIG. 3 is a schematic view illustrating the internal construction of an external-heater single-wafer heat-treatment apparatus according to the present invention where a reactor vessel as shown in FIG. 4 is used.
Figure 5:
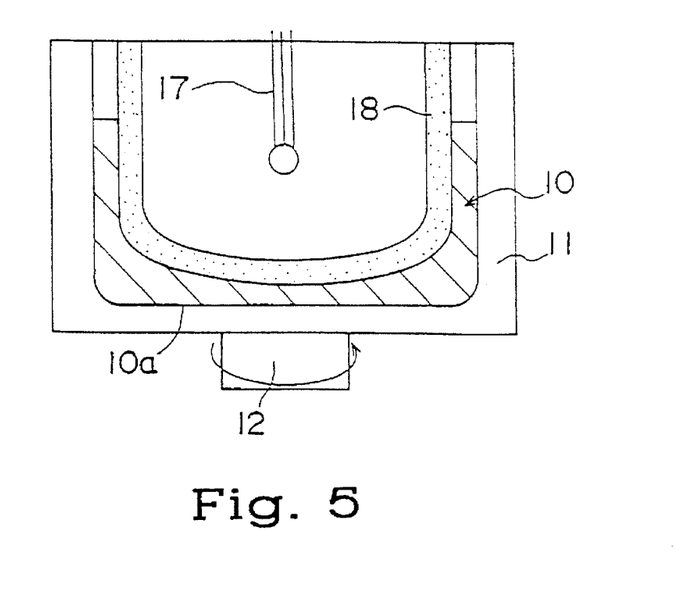
FIG. 5 is a schematic view illustrating the operational principle of an apparatus for manufacturing a reactor vessel as shown in FIG. 4.

FIG. 5 shows an apparatus for manufacturing a reactor vessel in the shape of a cylinder with a dome at the top for use in an external-heater type heat-treatment apparatus as shown in FIG. 3. A mold is attached to a mold holder 11 which is rotatable about a heat source 17.

First, the mold 10 gets rotated together with the holder 11 and then crystalline or amorphous quartz powder is fed into the mold 10 to form a quartz powder layer-like body 18 with a thickness of 20 mm along the inner surface of the mold 10 by means of centrifugal force. In sequence, a heat source 17 is disposed in a middle position inside the mold 10 and melting by heating is then conducted to manufacture a reactor vessel having a predetermined shape.

The thus manufactured vessel 1 (FIG. 4) is processed on the outer surface by grinding and polishing, further the side of the end opening is ground so that the end surface is aligned in a plane perpendicular to the axis of the vessel over the periphery, and if necessary, a flange 2 is joined, so that a reactor vessel 1 can be completed.

Figure 4:
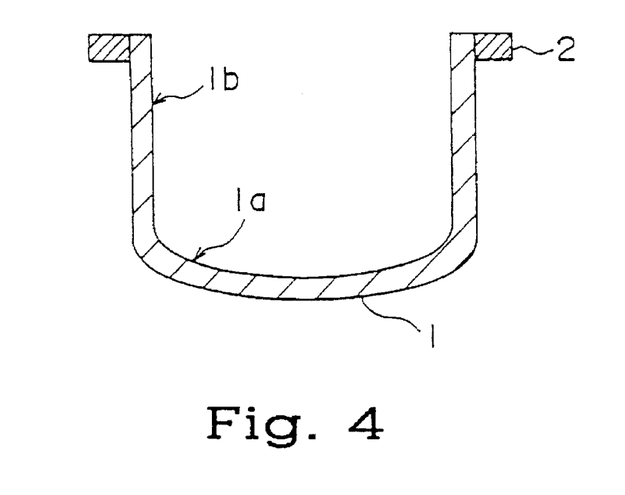
FIG. 4 is a sectional view of a reactor vessel used in an apparatus as shown in FIG. 3.

A reactor vessel 1 as manufactured in the same way as above was evaluated in regard to a bubble density. In the heated region 1a various bubbles of diameters dispersed in the range of 10 µm to 250 µm were measured at densities in the range of 20,000 bubbles/cm$^3$ to 40,000 bubbles/cm$^3$ and the transmittances were less than 30% and in the range of 10% to 20% at the passage of light having a wavelength of 2 µm.

On the other hand, in the non-heated region 1b, various bubbles of the same range of diameters were measured at densities larger than those of the heated region 1a, that is, ranging from 40,000 bubbles/cm$^3$ to 50,000 bubbles/cm$^3$ and transmittances were 10% or less at a wavelength of light of 2 µm.

Figure 7:
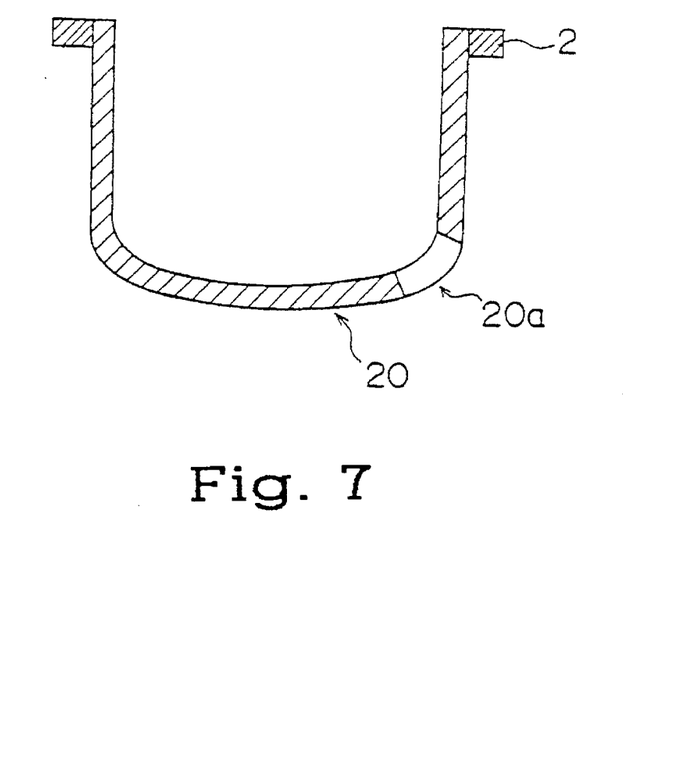
FIG. 7 is a sectional view of a reactor vessel used in an apparatus as shown in FIG. 6.
Figure 8:
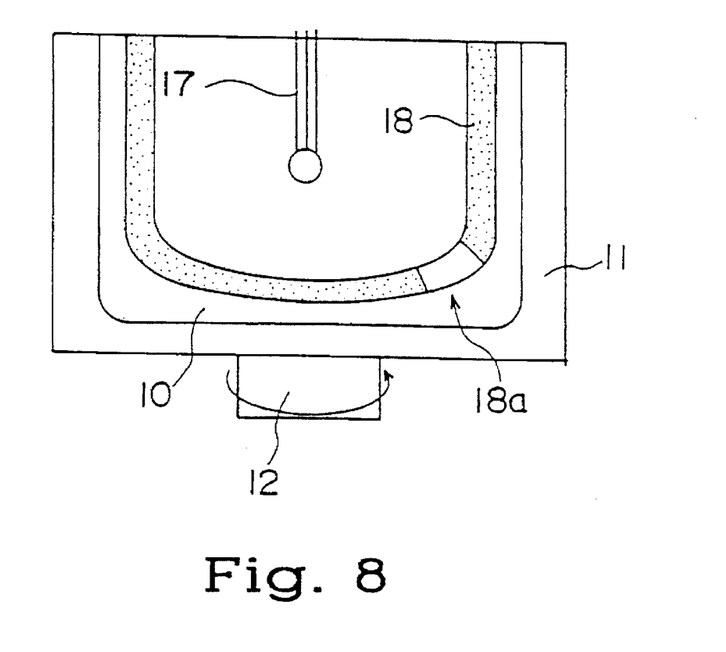
FIG. 8 is a schematic view illustrating the operational principle of an apparatus for manufacturing a reactor vessel as shown in FIG. 7.

FIG. 8 is an illustration of a method of manufacturing a reactor vessel with an observation-window as shown in FIG. 7. In the method of manufacturing as described above, when a quartz powder layer is formed a piece of transparent quartz glass is located in a desired position in the mold and the quartz powder layer-like body is formed with the piece being inserted within the body built-up and the quartz powder layer-like body is molten by heating from a heat source 17 to manufacture a reactor vessel with an observation-window of a predetermined shape.

A bubble content in each portion of the thus manufactured reactor vessel 20 which is not translucent or opaque was at densities ranging from 40,000 bubbles/cm$^3$ to 50,000 bubbles/cm$^3$ for the diameters of counted bubbles in the range of 10 µm to 250 µm.

Transmittances in portions except the observation window 20a at a wavelength of light of 2 µm were measured and the results were transmittances of much less than 30%, that is, in the range of 10% to 5%.

FIG. 3 is a view showing a single-wafer CVD apparatus in which a reactor vessel 1 as shown in FIG. 4 is used, where the quartz glass reactor vessel 1 having a shape like a dome is installed on a support table 3. A flange 2 joins the lower-end opening of the reactor vessel 1 along the outer periphery thereof and an O-ring 4 is embedded in the portion of the flange 2 facing the support table 3 to seal air-tight the interface between the reactor vessel 1 and the support table 3.

The flange 2 is laterally outwardly extended beyond the periphery of the support table 3 and the reactor vessel 1 is lifted by being engaged with a lift 5 at the outwardly extended portion of the flange 2a together with heater 30.

An external heater 30 surrounds the reactor vessel, so that the wafer is uniformly heated. A susceptor 7 of graphite or quartz glass is supported on support table 3, which is equipped with a gas inlet pipe 8 and an exhaust port 9. The susceptor 7 includes an internal heater 30a for heating the wafer 6 from the back thereof and thus the wafer 6 is heated not only on the front by the external heater from outside the reactor vessel 1, but also from the back by the internal heater 30a, so that the time required to reach a temperature at which film formation is carried out is shortened. Since the internal heater 30a is located under the wafer 6 and enveloped by the susceptor 7, there is no danger that particles from the internal heater 30a will pollute the surface of the wafer 6, even though the internal heater is present in the inside of the reactor vessel.

The gas inlet pipe 8 is configured in such a manner that a nozzle 8a attached at the fore-end is aimed in a direction at such a downward angle that the gas may be distributed all over the wafer 6. An inclination angle of the nozzle 8a is in the range of 0 to 45 degrees, preferably in the range of 15 to 30 degrees.

When a CVD film is formed on a wafer 6 by such an apparatus, first, the wafer 6 is heated, in such a state as shown in FIG. 3, to a predetermined temperature by both of the external heater 30 and the internal heater 30a, and then a CVD treatment is conducted while admitting a reaction gas from the nozzle 8a of the gas inlet pipe 8 in the vessel 1, so that a reaction for film formation is performed.

After completion of the film formation reaction, the lifter 5 is shifted upward to lift the reactor vessel 1, so that the wafer 6 is exposed to the air outside the vessel 1 and exchangeable with an untreated wafer 6 with ease.

The aforementioned operations of the treatment are repeatable with simplicity and ease.

Figure 6:
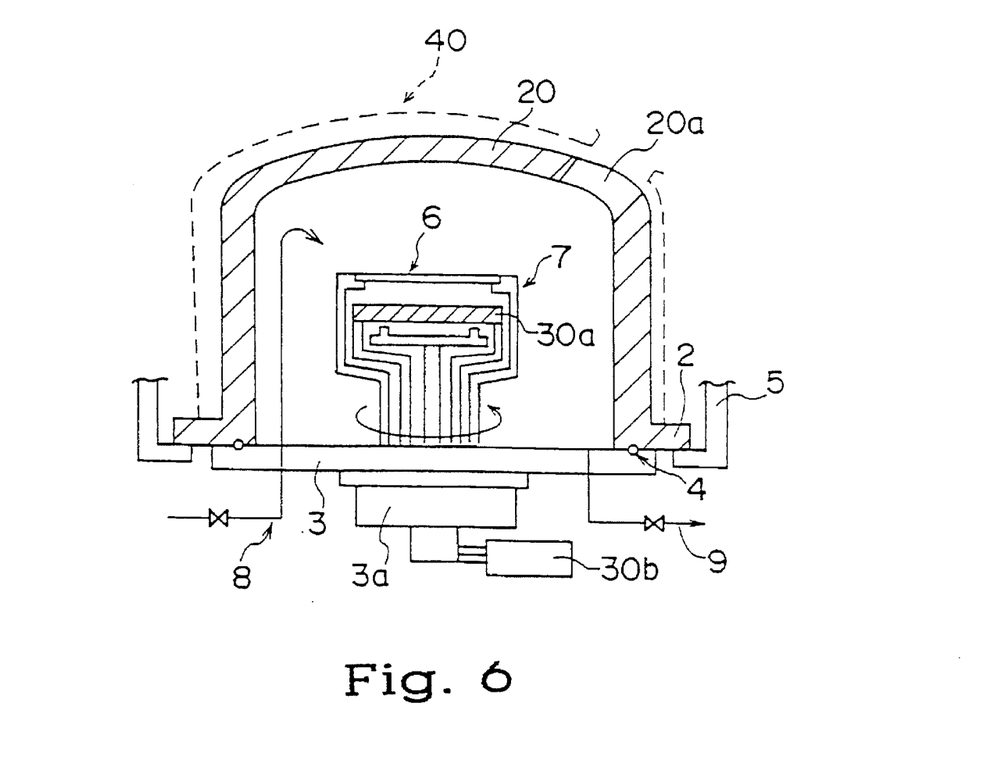
FIG. 6 is a schematic view illustrating the internal construction of an internal-heater single-wafer heat-treatment apparatus according to the present invention where a reactor vessel as shown in FIG. 7 is used.

FIG. 6 is a view showing a single-wafer CVD apparatus which comprises a quartz glass reactor vessel 20 as shown in FIG. 7, formed as a single body with no welded portion. A susceptor 7 and a heater 30a are disposed in the center region of a support table 3 and rotated by motor 3a and heated by an electrical power source 30b both disposed under the support table 3. An inlet pipe 8 and exhaust port 9 for a reaction gas are provided in the support table 3 and the pressure inside the vessel 20 is kept constant. The reactor vessel 20 is placed on the support table 3 with an O-ring 4 lying therebetween and when occasion demands, a chamber 40 for heat insulation or shading of light may be installed outside of the vessel 20. The reactor vessel 20 is engaged with a lifter 5 by way of flange 2 and moved away from the support table 3 by the lifter 5 in order to remove wafer 6. A transparent portion 20a for observation of the inside from above the vessel 20 is formed in a position on the vessel 20.

In such a manner as described above, in an inner-heater type apparatus, a shorter interval between the wafer 6 and the heater 30a can be realized and a time required for heating-up the wafer 6 from a preheating temperature to a reaction temperature, for example, 1100° C. can also be shortened and thereby productivity is improved.

In both examples, because all piping is attached to the lower surface of the support table 3, in other words, because no part of handling a liquid is attached on the side of the reactor vessel 1, the reactor vessel 1 is shiftable vertically upwardly together with the heater 31 and thereby exchange of wafers 6 and maintenance of all the apparatus are performed more easily. These features make it possible to improve working efficiency and also realize simplification of facilities including the apparatus.

Figure 11:
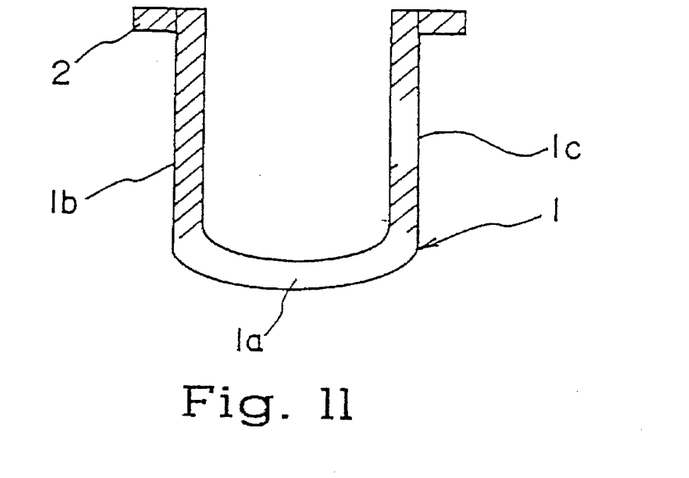
FIG. 11 is a sectional view of a reactor vessel used in an apparatus as shown in FIG. 9.
Figure 12:
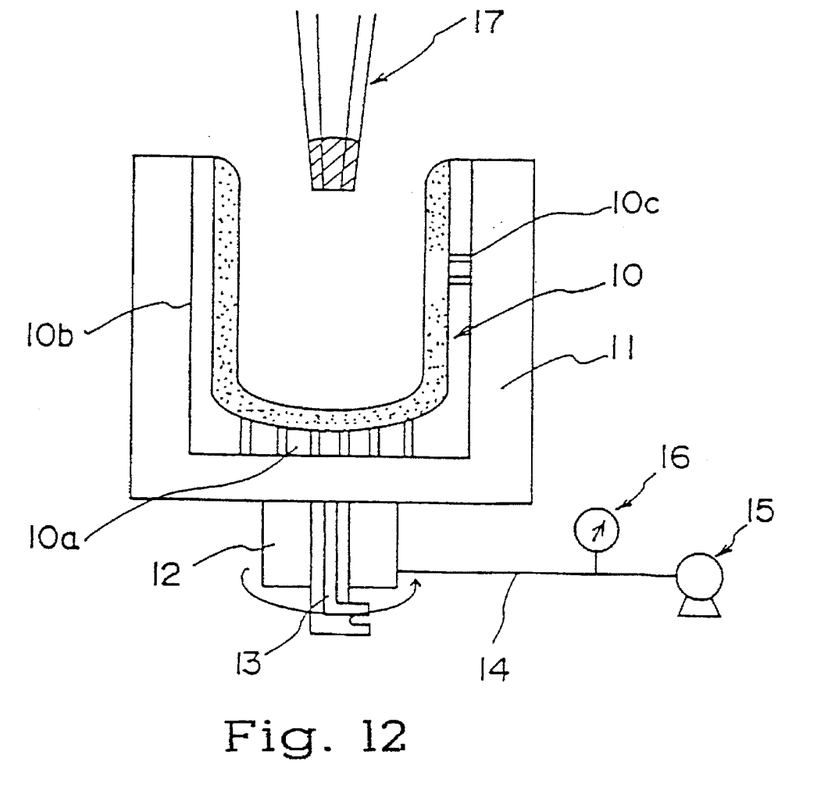
FIG. 12 is a schematic view illustrating the operational principle of an apparatus for manufacturing a reactor vessel as shown in FIG. 11.

FIG. 12 is a schematic view illustrating the operational principle of an apparatus for manufacturing a reactor vessel of a shape of approximation of a dome according to the second embodiment of the present invention as shown in FIG. 11. The apparatus of manufacturing the reactor vessel comprises a mold 10 which is freely rotatable, a mold holder 11 which detachably holds the mold 10, a motor 12 for rotating the mold 10 together with the holder 11, a coolant channel 13 for cooling the holder 11, a vacuum pipe 14 connected to the bottom 10a of the mold 10 and suction through-holes 10c formed in the side wall 10b of the mold 10, and a vacuum pump 15 and a pressure gauge 16 connected to the vacuum pipe 14. The mold 10 has an internal wall of similar form to the outer form of the reactor vessel. The internal size of the wall is slightly larger than the outer size of the reactor vessel by an amount which is ground off of the vessel 1 after the molding operation. Further, the bottom 10a of the mold 10 corresponding to the ceiling portion 1a of the reactor vessel 1 is composed of gas-permeable carbon and the side wall 10b is composed of gas-tight carbon, where nine through-holes 10c each 0.9 mm in diameter are formed within an area corresponding to the window portion 1c of the vessel 1 in the side portion 10b, in concrete terms, within the square area of a side of 3 cm in the side portion 10b. Upward of the mold 10, a heat source 17 is equipped for melting by heating that is freely shiftable vertically, upward or downward. The vacuum-suction pump 15 is best chosen with an exhaust capacity of 2.5 m$^3$/min or more, preferably, of 5 m$^3$/min or more. In the example, the exhaust pump 15 having an exhaust capacity of 4 m$^3$/min is used.

In the following a method of manufacturing a reactor vessel 1 using the apparatus of FIG. 12 is described. The method comprises the following steps: first, the mold 10 is rotated together with the holder 11; then, crystalline or amorphous quartz powder is fed into the mold 10 to form a shaped quartz powder layer 18 having a thickness of 20 mm along the inner side surface of the mold 10 by centrifugal force. In succession, the heat source 17 is positioned in the middle of the space of the interior of the mold 10; then, the vacuum suction pump 15 is activated to reduce a pressure in the quartz powder shaped layer 18 to as low as a gauge pressure of −600 mm Hg or less, preferably −700 mm Hg or less. Soon after reaching a desired gauge pressure, the shaped quartz powder layer 18 is heated until a thin molten layer is formed on the inner side surface of the layer 18 and further until the molten layer grows to a proper thickness, while the vacuum suction is kept on. When the thin molten layer is formed on the layer 18, a gauge pressure in the layer 18 is lowered to −700 mm Hg or less. Rotation of the mold 10 and melting by heating are continued at this gauge pressure, so that the portion 1a corresponding to the bottom portion 10a of the mold 10, the window portion 1c becomes transparent, the side portion 1b becomes translucent or opaque, and a reactor vessel 1 having a predetermined form is obtained.

If the reducing of pressure is started after a thin molten layer is formed on the inner side surface of the shaped quartz powder layer 18, minute bubbles unfavorably remain in the molten layer. The reducing of pressure should be started before the thin molten layer is formed, and it is preferably started immediately before starting of the melting by heating or at latest at the same time when starting of the melting by heating. The thus obtained vessel 1 as an intermediate product is ground and mirror-polished both on the outer surface and the inside surface, the end of the opening is ground so as to align all the end surface in a plane, and if necessary the flange 2 is joined with the thus finished end, so that a reactor vessel 1, as shown in FIG. 11, both the ceiling portion 1a and the window portion 1c of which are transparent and the side portion 1b of which is translucent or opaque is finally manufactured. The bubbles have a diameter in the range of 10 μm and a density of 40,000 bubbles/cm$^3$ or more, no clear boundary is present between the transparent portion 1a and 1c, and the translucent or opaque portion 1b. The transmittance of the ceiling portion 1a of the vessel 1 was by far more than 85% and more 90% or more in some measured points, the transmittance of the side portion 1b was on the contrary much lower than 40% and in some points 10% or less.

Figure 13:
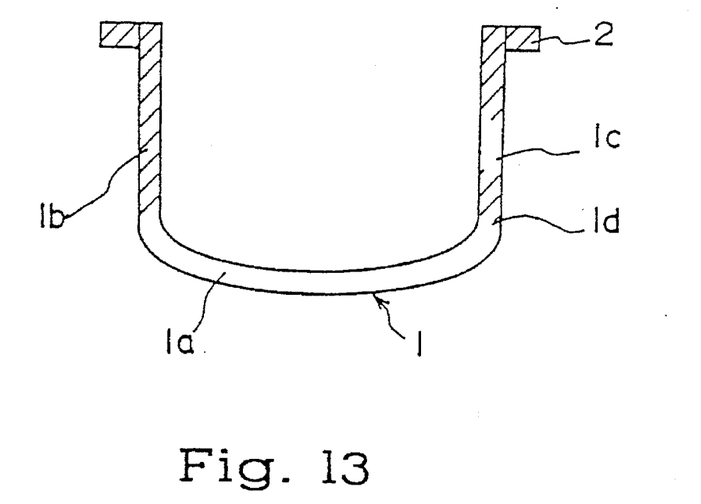
FIG. 13 is a sectional view of a reactor vessel used in an apparatus as shown in FIG. 9.
Figure 14:
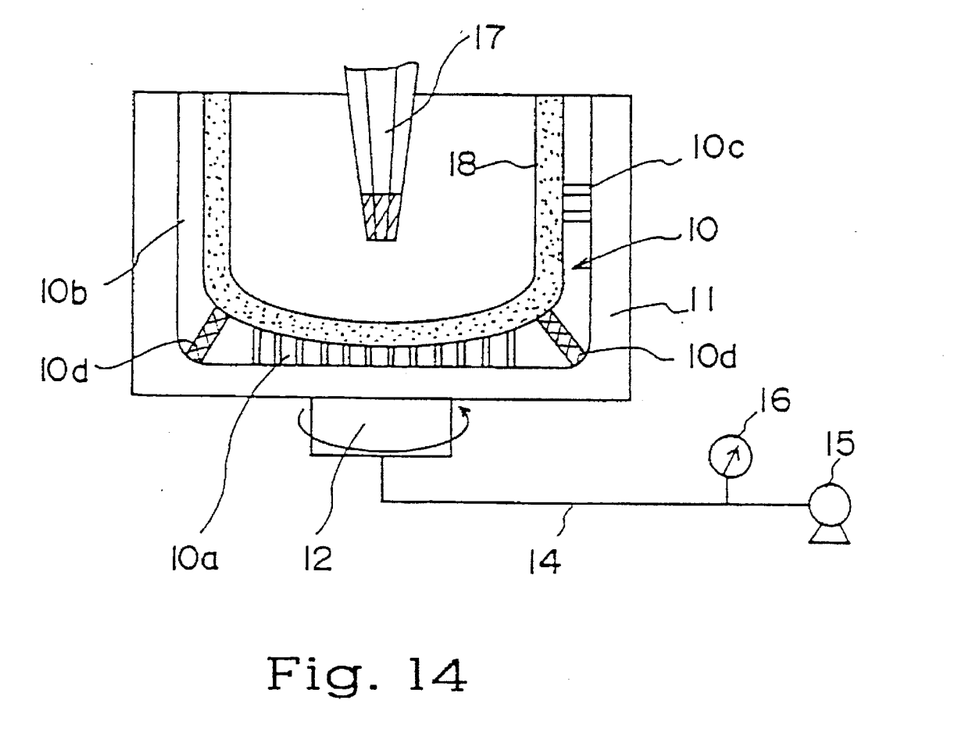
FIG. 14 is a schematic view illustrating the operational principle of an apparatus for manufacturing a reactor vessel as shown in FIG. 13.

FIG. 14 is a schematic view illustrating the operational principle of an apparatus for manufacturing a reactor vessel 1 as shown in FIG. 13 having area 1d which is halfway in transmittance between the transparent ceiling portion 1a and the translucent or opaque side portion 1b. Special suction holes 10d in which gas-permeable carbon is filled are formed along the lower end of the side portion 10b adjacent to the bottom portion 10a to realize a gradual change in bubble densities. Bubble content in the half level region were 20,000 bubbles/cm$^3$ or more when bubbles having diameters dispersed in the range of 10 μm to 250 μm were counted and the transmittance of heat was measured at values of 30% or less, which satisfies a condition of the present invention.

Figure 9:
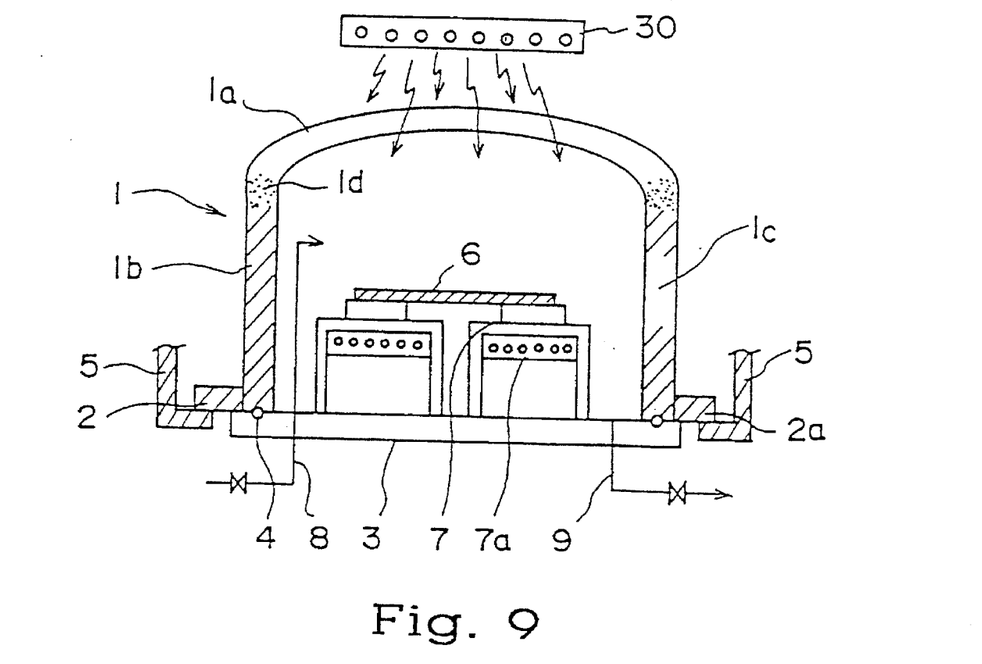
FIG. 9 is a schematic view illustrating the internal construction of a single-wafer heat-treatment apparatus according to the present invention where a reactor vessel as shown in FIG. 11 is used.

FIG. 9 is a schematic view illustrating the internal construction of a single-wafer CVD apparatus formed by using a reactor vessel 1 shown in FIG. 13 having a shape like a cylinder with a dome at the top placed on a support table 3 composed of quartz glass. An O-ring 4 is inserted between the vessel and the support table 3 to assure airtight sealing between the reactor vessel 1 and the support table 3. The flange 2 extends outwardly of the outer periphery of the support table 3, the reactor vessel 1 is lifted together with a heater lamp by a lifter 5 which engages with the overlapping part 2a. By the lifting, a wafer 6 is relieved to the open air outside the reactor vessel 1, which makes it easy to exchange wafers.

A susceptor 7 of graphite or quartz glass is supported on support table 3, which is equipped with a gas inlet pipe 8 and an exhaust port 9. A heat source 7a is contained in the susceptor 7 for heating the wafer 6 from the back. The wafer 6 is consequently heated by the heat source 7a on the back side thereof as well as by a lamp 30 installed above the transparent ceiling portion 1a of the vessel 1, so that the wafer 6 is heated up to a temperature of film formation in a shorter time due to both sided heating. Since the heat source 7a is located under the wafer 6 and beside is contained in the susceptor 7, though the heat source 7a is present in the vessel 1, particles produced from the heat source 7a has no risk to attach on the surface of the wafer 6.

The wafer 6 is preferably located in the internal space of the vessel corresponding to the translucent or opaque portion 1b extending downwardly of the ceiling portion 1a of the vessel 1, thereby guaranteeing insulation and uniformity in heating in the wafer heating region. The position of the wafer is also preferably selected so that the height of the wafer 6 is equal to or slightly lower than that of the window portion 1c and thereby a state of film formation on the wafer 6 is observable through the window portion 1c from outside the vessel 1.

The inlet pipe 8 extends vertically to above the wafer 6 and a nozzle 8a attached at the fore end of the pipe 8 is downwardly directed in order that the gas is distributed all over the wafer 6. An angle of inclination of the gas nozzle 8a is preferably set in the range of 0 degree to 45 degrees, more preferably in the range of 15 degrees to 30 degrees. The heating lamp 30 is located above the transparent ceiling portion 1a of the vessel 1.

When a CVD film is formed with the apparatus of FIG. 9, the operation proceeds as follows: first, a wafer 6 is heated from both sides by the heating lamp 30 and the heat source 7a to heat up to a predetermined temperature. Second, a reaction gas is fed from the nozzle 8a of the pipe 8 introducing the gas and the reaction of film formation is carried out. Third, after completion of the reaction of film formation, the reactor vessel is lifted by shifting the lifter 5 vertically upwardly, and finally, as a result, the wafer 6 is exposed to the open air outside the vessel 1 and wafers 6 are exchanged with ease. All the aforementioned steps can be repeated for subsequent film formation on wafers with ease and simplicity.

Figure 15:
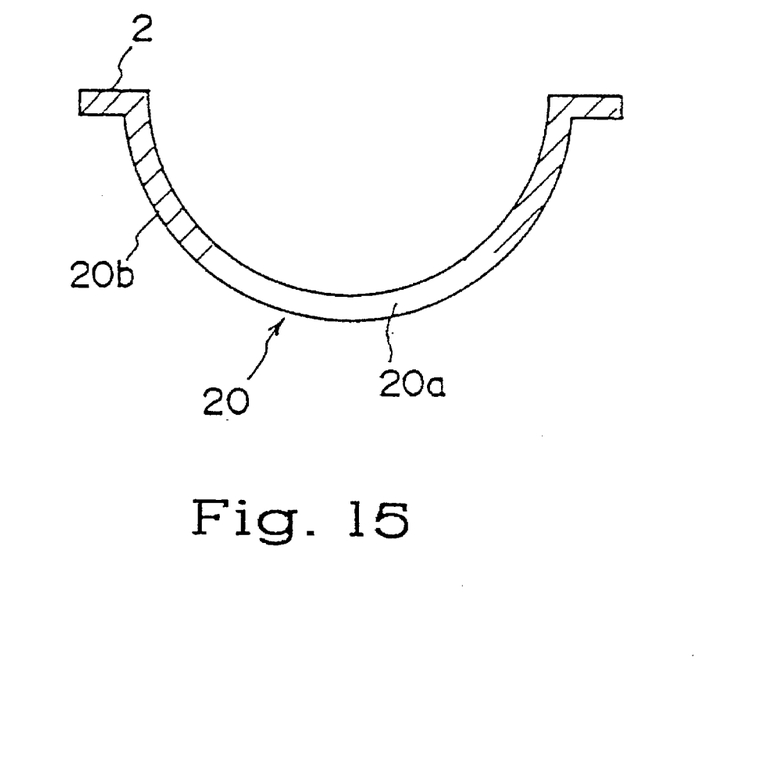
FIG. 15 is a sectional view of a reactor vessel used in an apparatus as shown in FIG. 10.
Figure 16:
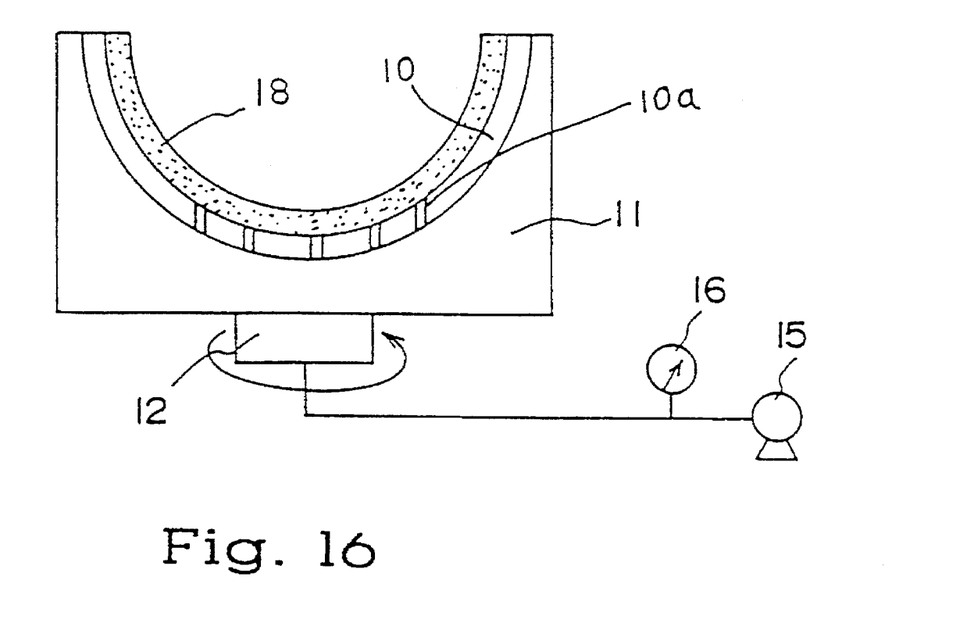
FIG. 16 is a schematic view illustrating the operational principle of an apparatus for manufacturing a reactor vessel as shown in FIG. 15.

FIG. 16 is a schematic view illustrating the operational principle of an apparatus for manufacturing a reactor vessel 20 of a shape like a hemisphere having a transparent ceiling portion 20a and a translucent or opaque portion extending to the flange 2 of the lower end opening of the vessel 20 as shown in FIG. 15. This is manufactured in a similar method to that of the aforementioned examples.

Figure 10:
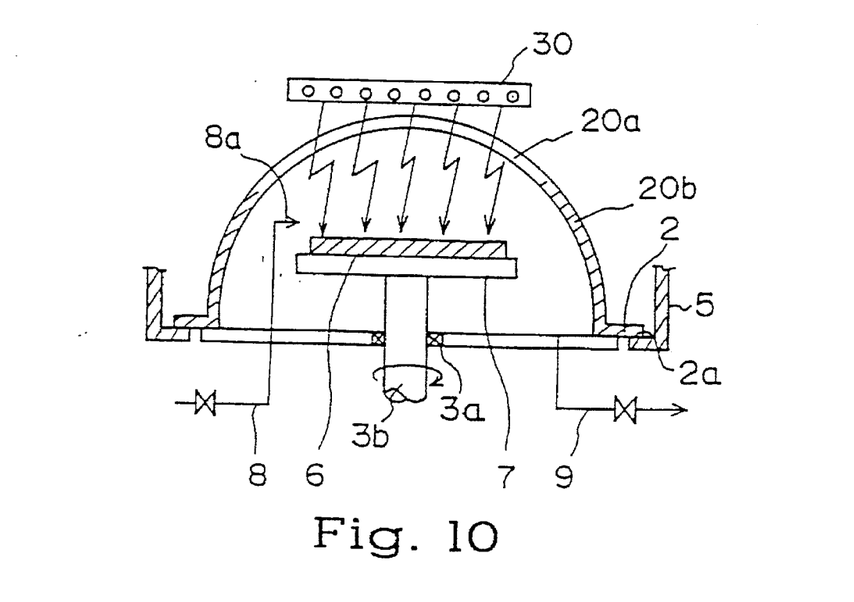
FIG. 10 is a schematic view illustrating the internal construction of a single-wafer heat-treatment apparatus according to the present invention where a reactor vessel as shown in FIG. 15 is used.

FIG. 10 is a schematic view illustrating the internal construction of a single-wafer CVD apparatus formed by using a reactor vessel 1 shown in FIG. 15. A rotary shaft 3b is vertically installed by means of a bearing 3a in the center of a support table 3 and a susceptor 7 is fixedly mounted on the top of the rotary shaft 3b. The susceptor 7 does not include a heat source therein so as not to exert a bad influence on the bearing 3a. The shape of the reactor vessel 1 is however constructed in the shape of a hemisphere, the distance between a heating lamp 30 which is located above the vessel 20 and the wafer 6 is minimized as much as possible, so that the wafer 6 can be heated up to a predetermined temperature in a shorter time.

With the vessel 20 of FIGS. 10 and 15, the distance between the sealing portion 20d of the lower end of the reactor vessel 20 and a ceiling portion 20a thereof is shortened. Since a translucent or opaque portion 20b is formed between the sealing portion 20d and ceiling portion 20a, undesirable conduction of heat and heat deterioration of the sealing portion 20d does not occur.

What is claimed is:

1. Apparatus for heat treating a wafer, said apparatus comprising a reactor vessel comprising a quartz glass body, said quartz glass body comprising ceiling means and sidewall means defining an enclosure having an open end with an outer periphery, said quartz glass body being formed as a unitary body without any welding and with bubbles distributed throughout at least a part of said body so as to render at least a part of said body translucent or opaque, said ceiling means being formed without bubbles, whereby said ceiling means is transparent, support means for supporting a wafer in a predetermined position in said enclosure defined by said quartz glass body, and heating means for heating a wafer supported at said predetermined position, said heating means comprising an infrared heater outside said reactor vessel and positioned to heat a wafer at said predetermined position.

2. Apparatus as in claim 1 wherein said reactor vessel further comprises a flange welded to said outer periphery of said quartz glass body.

3. Apparatus as in claim 1 wherein said quartz glass body has a hemispherical shape.

4. Apparatus as in claim 1 wherein said sidewall means is shaped as a cylinder and said ceiling means is shaped as a dome.

5. Apparatus as in claim 1 wherein said support means comprises a support table against which said open end of said quartz glass body is placed with sealing means therebetween.

6. Apparatus as in claim 5 further comprising gas inlet means and gas outlet means passing through said support table.

7. Apparatus as in claim 1 wherein at least a substantial portion of said sidewall means has a light transmittance of 1 to 30% at a wavelength of 2 μm.

8. Apparatus as in claim 7 wherein said substantial portion of said sidewall means has bubbles with diameters ranging from 10 μm to 250 μm and a density of 20,000 bubbles/cm$^3$ to 100,000 bubbles/cm$^3$.

9. Apparatus as in claim 1 wherein said sidewall means has a window portion which is formed without bubbles, whereby said window portion is transparent.

10. Apparatus as in claim 1 wherein said ceiling portion has a light transmittance of 85% or more at a wavelength of 2 μm and at least a substantial portion of said sidewall means has a transmittance of 30% or less at a wavelength of 2 μm.

11. Apparatus as in claim 1 wherein said quartz glass body further comprises a transition zone between said ceiling means and said sidewall means, said bubbles having a density which increases gradually in said transition zone from said ceiling means to said sidewall means.

* * * * *

UNITED STATES PATENT AND TRADEMARK OFFICE
CERTIFICATE OF CORRECTION

PATENT NO. : 5,651,827
DATED : July 29, 1997
INVENTOR(S) : Aoyama et al

It is certified that error appears in the above-identified patent and that said Letters Patent is hereby corrected as shown below:

On the title page: Item [54] delete --AND METHOD OF MANUFACTURING REACTOR VESSEL USED FOR SAME --.

Column 1, lines 2-4 delete --AND METHOD OF MANFACTURING REACTOR VESSEL USED FOR SAME --.

Signed and Sealed this

Fourteenth Day of September, 1999

Attest:

Q. TODD DICKINSON

*Attesting Officer*    Acting Commissioner of Patents and Trademarks